(12) United States Patent
Lee

(10) Patent No.: US 7,961,239 B2
(45) Date of Patent: Jun. 14, 2011

(54) CMOS IMAGE SENSOR WITH INTERPOLATED DATA OF PIXELS

(75) Inventor: Youn Jung Lee, Gyeonggi-do (KR)

(73) Assignee: MTEK Vision Co., Ltd., Seoul (KR)

( * ) Notice: Subject to any disclaimer, the term of this patent is extended or adjusted under 35 U.S.C. 154(b) by 309 days.

(21) Appl. No.: 11/571,371

(22) PCT Filed: Jun. 16, 2005

(86) PCT No.: PCT/KR2005/001841
§ 371 (c)(1),
(2), (4) Date: Dec. 28, 2006

(87) PCT Pub. No.: WO2006/001615
PCT Pub. Date: Jan. 5, 2006

(65) Prior Publication Data
US 2008/0049112 A1 Feb. 28, 2008

(30) Foreign Application Priority Data
Jun. 28, 2004 (KR) .................. 10-2004-0048740

(51) Int. Cl.
*H04N 5/335* (2011.01)
(52) U.S. Cl. .................. 348/308; 348/294; 348/311
(58) Field of Classification Search .................. 348/308, 348/294
See application file for complete search history.

(56) References Cited

U.S. PATENT DOCUMENTS

| 6,522,356 B1 * | 2/2003 | Watanabe ............... 348/272 |
| 2004/0100570 A1 * | 5/2004 | Shizukuishi ............ 348/272 |
| 2004/0108525 A1 * | 6/2004 | Sekine ................... 257/202 |
| 2004/0174446 A1 * | 9/2004 | Acharya ................. 348/279 |

FOREIGN PATENT DOCUMENTS

| JP | 63-098147 A | 4/1988 |
| JP | 08-251347 A | 9/1996 |
| JP | 2004-128193 A | 4/2004 |
| KR | 2001-082096 A | 8/2001 |

* cited by examiner

*Primary Examiner* — Sinh Tran
*Assistant Examiner* — Selam Gebriel
(74) *Attorney, Agent, or Firm* — Birch, Stewart, Kolasch & Birch, LLP

(57) ABSTRACT

The present invention relates to a CMOS image sensor. According to the present invention, the CMOS image sensor includes a two-dimensional pixel array (110), a row decoder (130), and a column decoder (150). The two-dimensional pixel array (110) includes rectangular unit pixels each having a width to length ratio of 1:2. The row decoder (130) is placed on one side of the pixel array to designate a row address. The column decoder (150) is placed on another side of the pixel array to be perpendicular to the row decoder and is adapted to extract data of respective pixels from a row selected by the row decoder, amplify the extracted data and generate image data including pixel values. As a result, the present invention is advantageous in that it can easily perform interpolation compared to an image sensor having regular quadrilateral unit pixels.

12 Claims, 6 Drawing Sheets

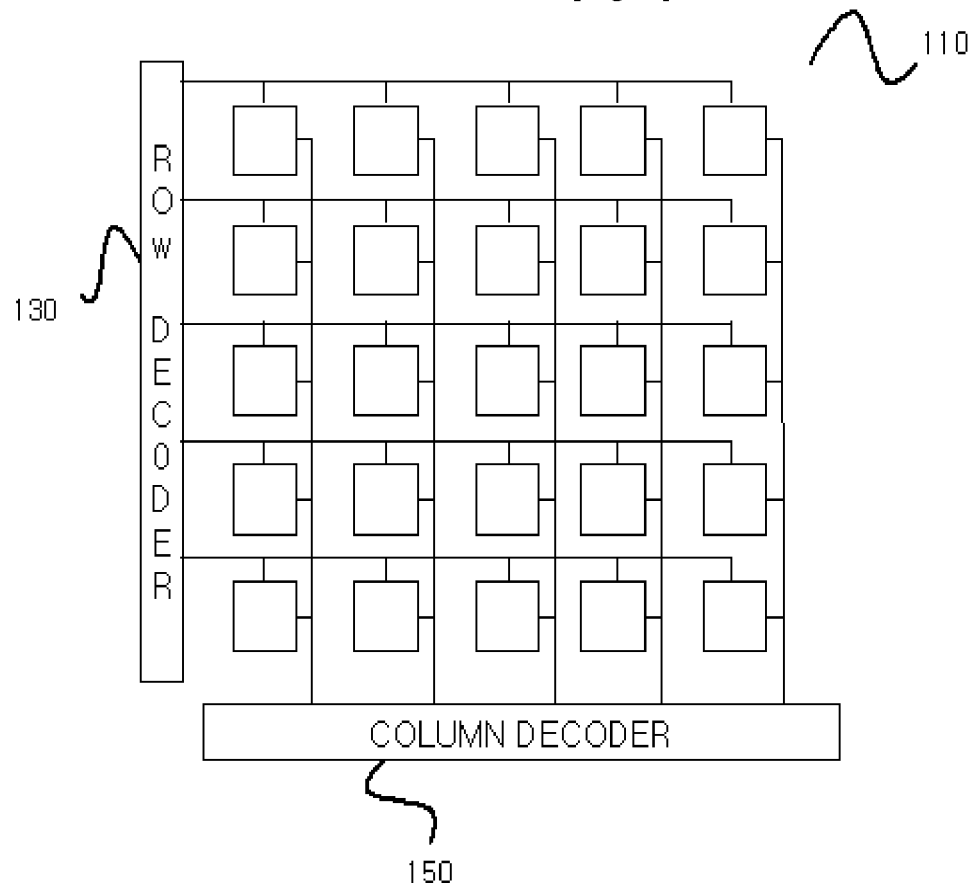
[Fig. 1]
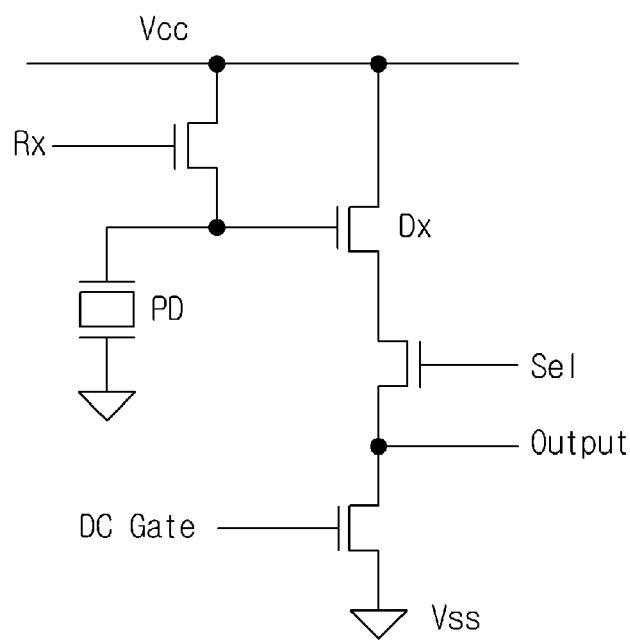
[Fig. 2]

[Fig. 3] PRIOR ART
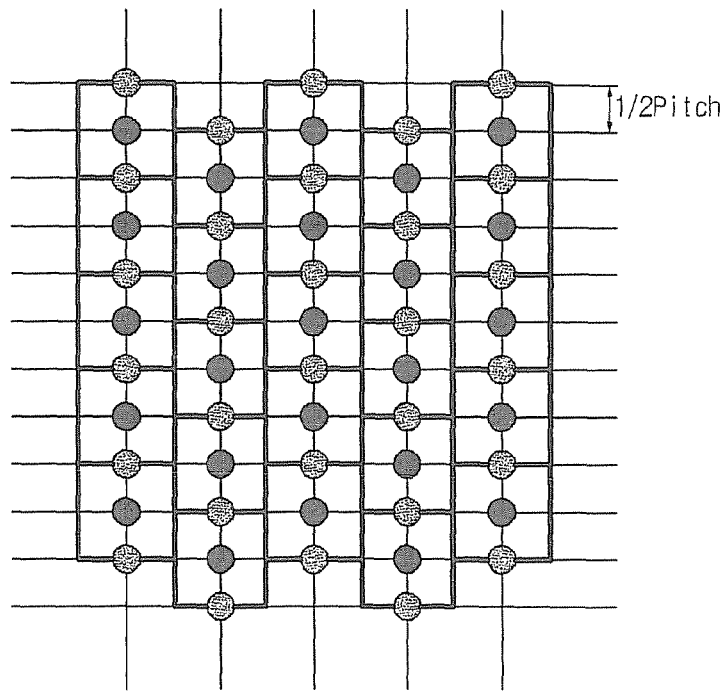
[Fig. 4]
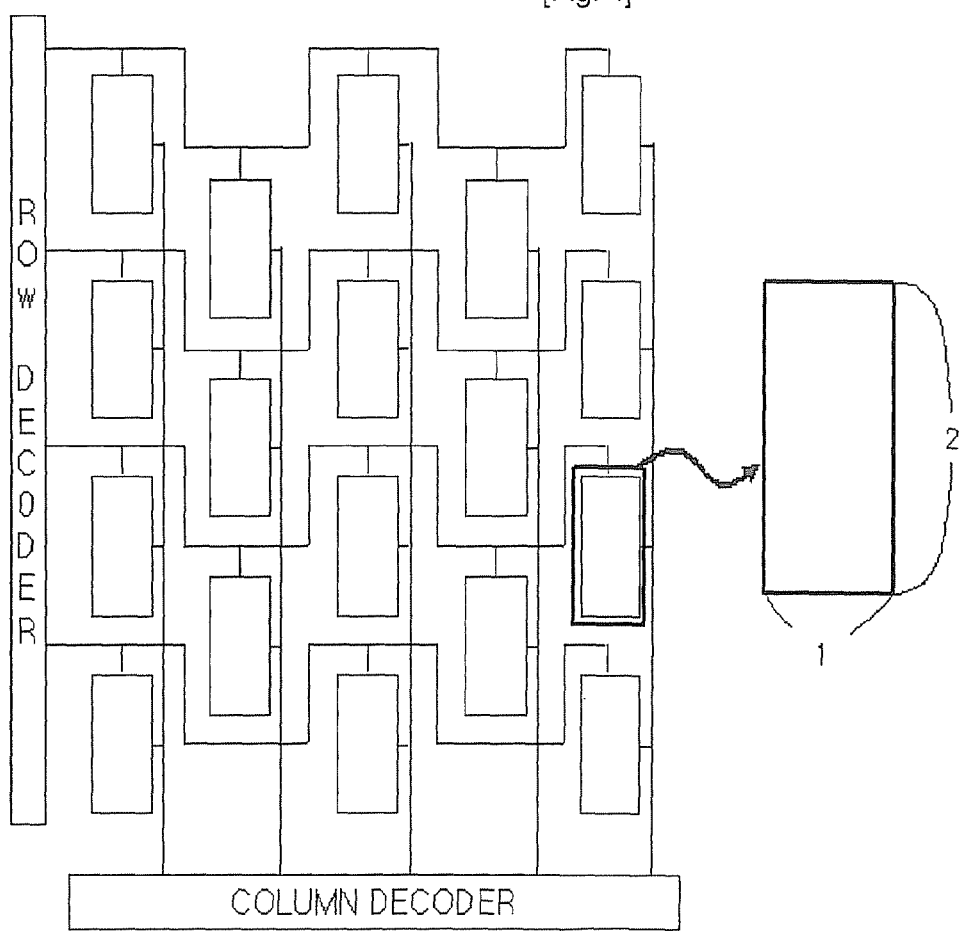

[Fig. 5]
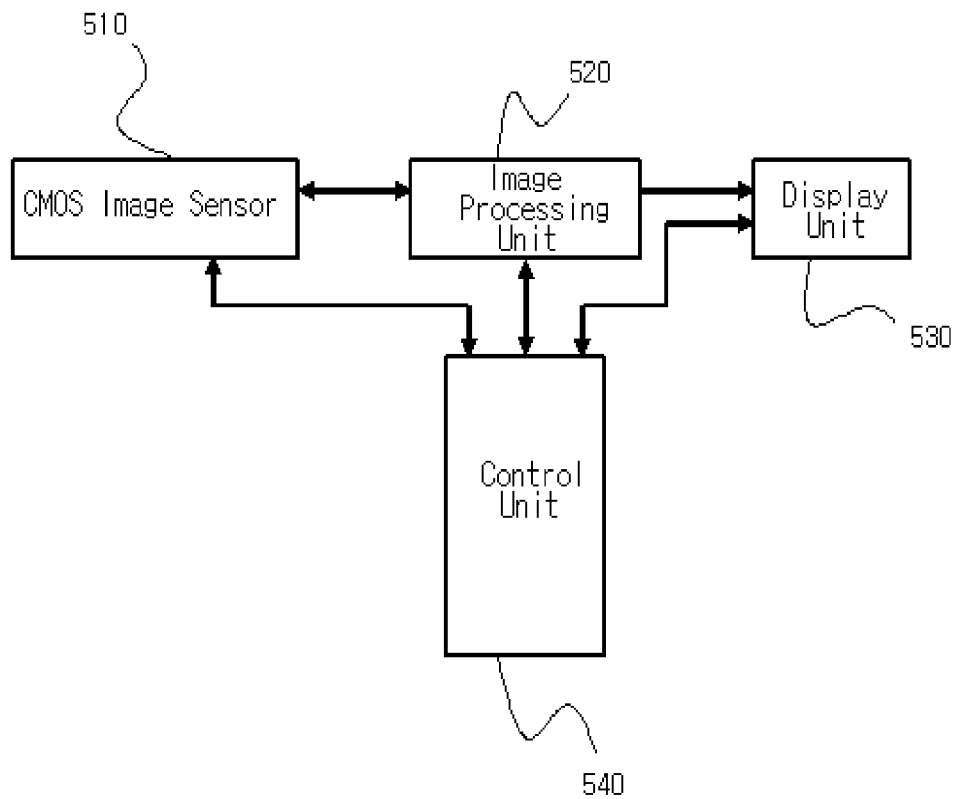
[Fig. 6]
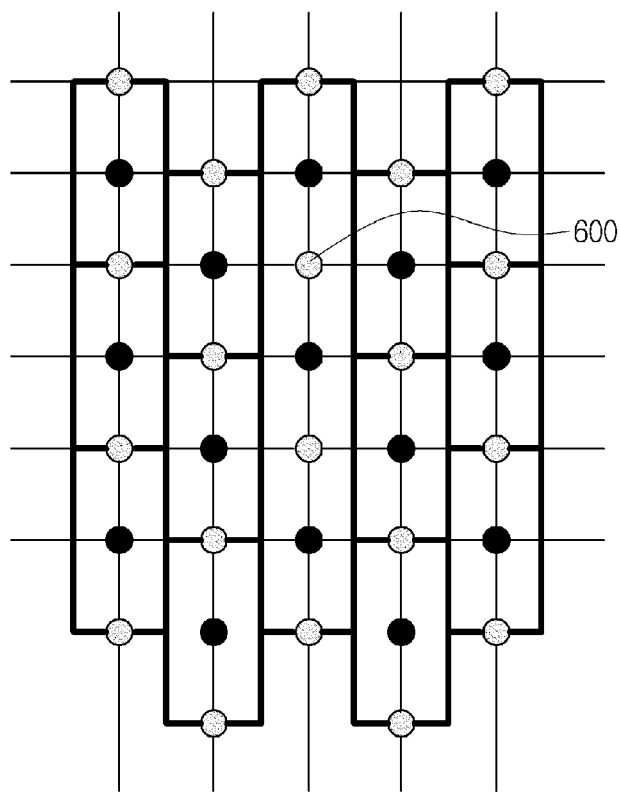

[Fig. 7]
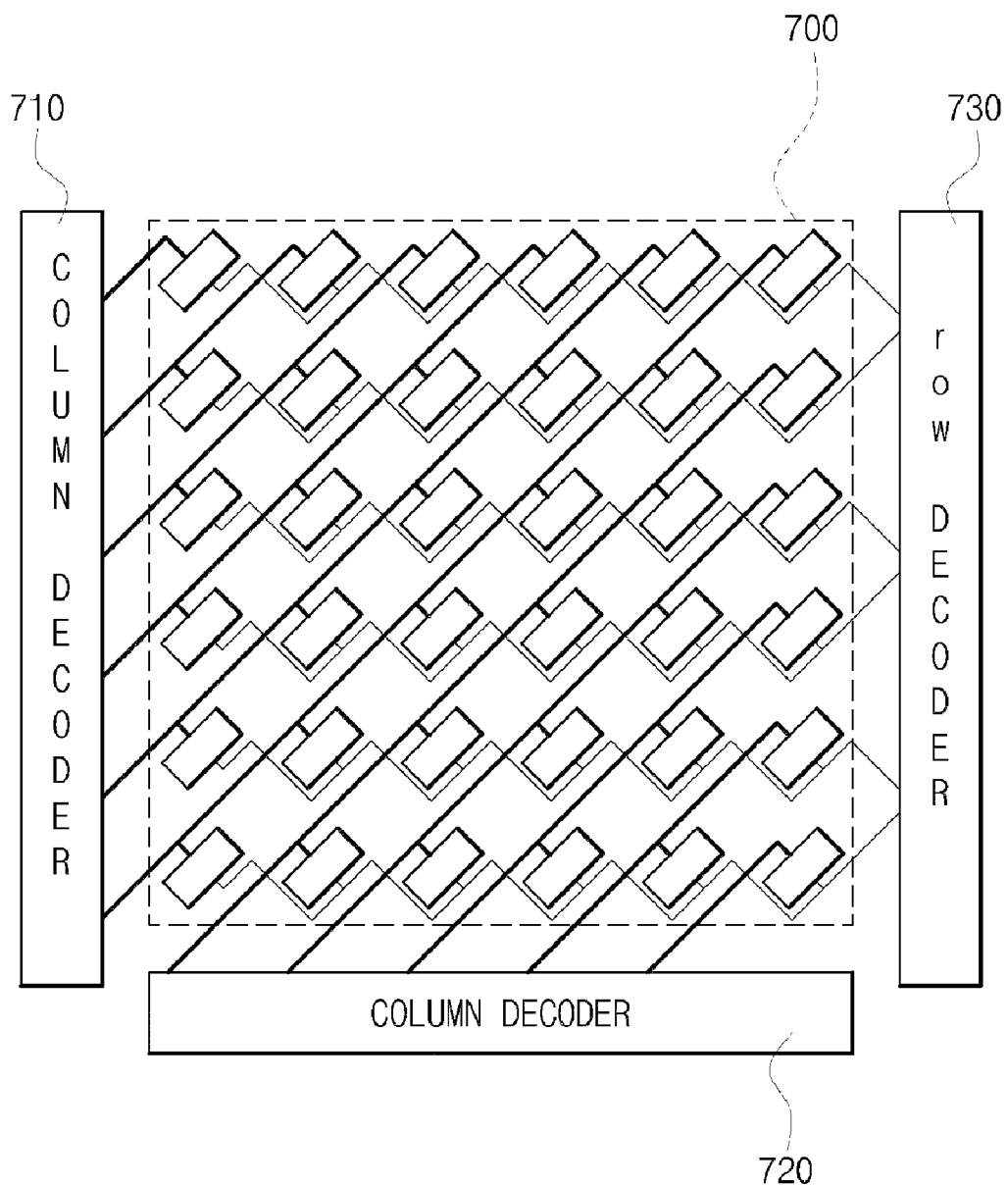

[Fig. 8]
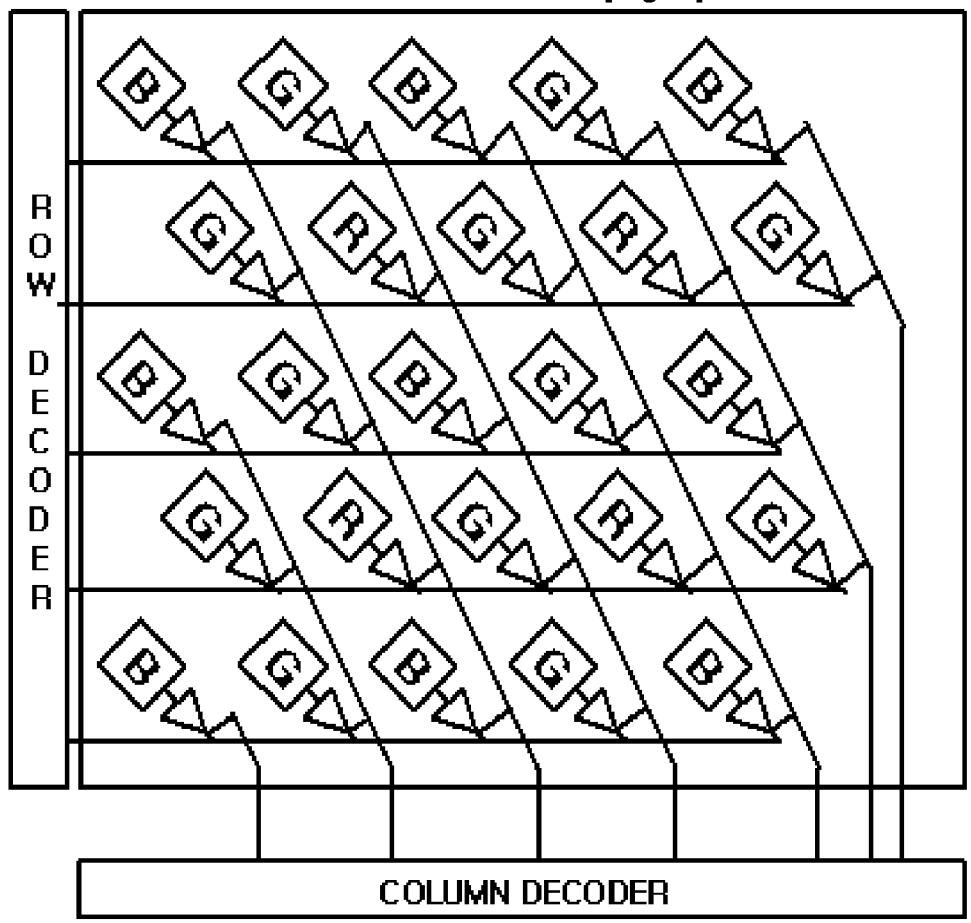
[Fig. 9]
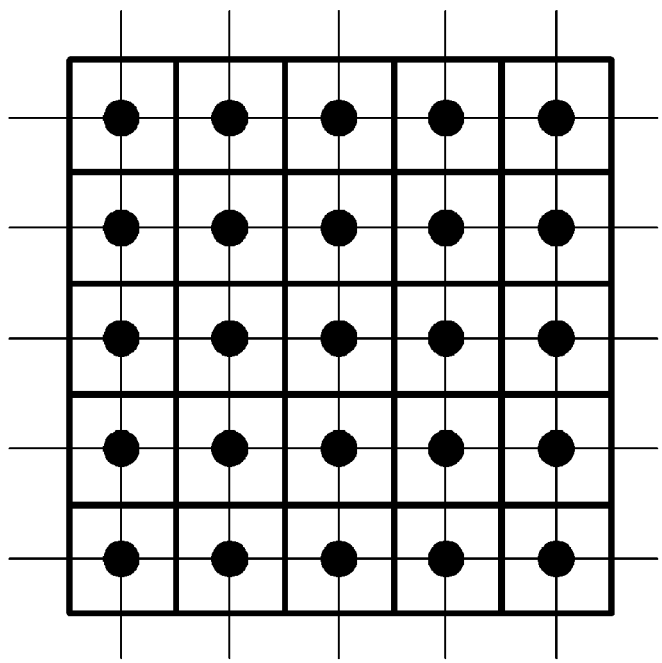

[Fig. 10]
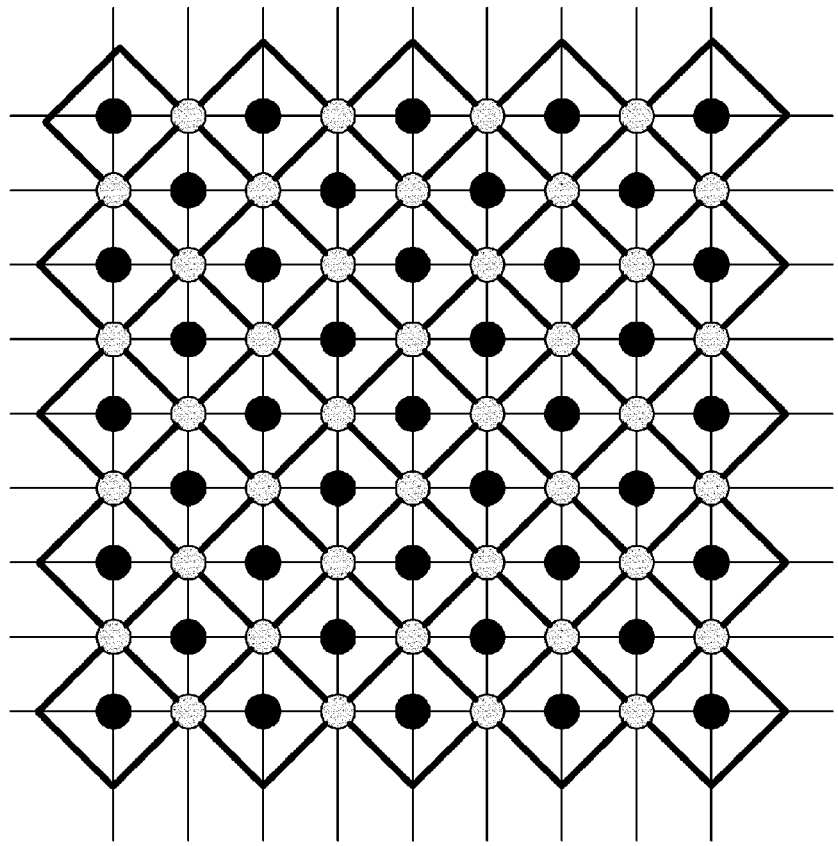
[Fig. 11]
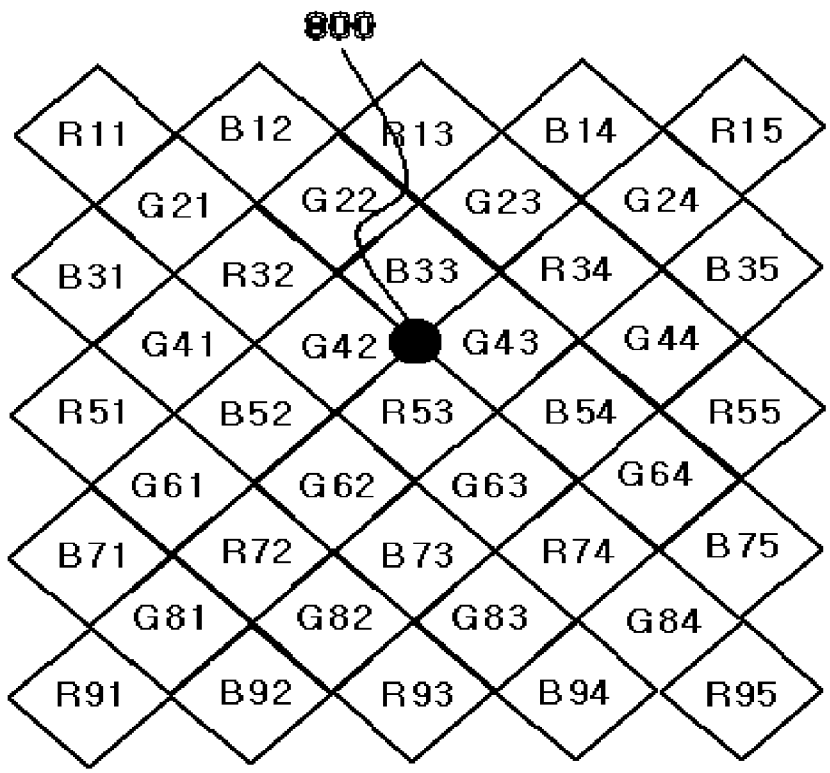

CMOS IMAGE SENSOR WITH INTERPOLATED DATA OF PIXELS

CROSS REFERENCE TO RELATED APPLICATIONS

This application is a U.S. National Application of International Application PCT Application No. PCT/KR05/001841 filed on Jun. 16, 2005, which claims the benefit of priority from Korean Patent Application No. 10-2004-0048740 filed on Jun. 28, 2004. The disclosures of International Application PCT Application No. PCT/KR05/001841 and Korean Patent Application No. 10-2004-0048740 are incorporated herein by reference.

TECHNICAL FIELD

The present invention relates, in general, to CMOS image sensors and, more particularly, to a CMOS image sensor, which uses polygonal unit pixels, or rectangular unit pixels each having a width to length ratio of 1:2, thus doubling resolution while maintaining sensitivity.

BACKGROUND ART

Recently, digital cameras or camera phones have been rapidly developed and commercialized. Such a digital camera or camera phone senses light using a semiconductor sensor. As the semiconductor sensor, a Complementary Metal-Oxide Semiconductor (CMOS) image sensor or a Charged Coupled Device (CCD) sensor is generally used.

A CMOS image sensor is a device that converts an optical image into an electrical signal using CMOS manufacturing technology. In the CMOS image sensor, MOS transistors, the number of which corresponds to the number of pixels, are formed, and a switching scheme of sequentially detecting output using the MOS transistors is employed. Compared to a CCD image sensor that has been currently and widely used as an image sensor, the CMOS image sensor is advantageous in that a driving method is convenient, various scanning schemes can be implemented, a signal processing circuit can be integrated into a single chip to miniaturize products, compatible CMOS technology is used to decrease manufacturing costs, and power consumption can be greatly decreased.

FIG. 1 is a view showing a CMOS image sensor having regular quadrilateral unit pixels. As shown in FIG. 1, around the pixel array 110, a row decoder 130 to designate a row address is arranged on any one side of a pixel array 110, and a column decoder 150, which is connected to the data output of pixels and serves to designate a column address of the pixels, is arranged perpendicular to the row decoder 130.

In detail, a process of extracting data from an image sensor is performed so that the row decoder 130 selects a first row and the column decoder 150 extracts the data of respective pixels from the first row, and then amplifies the data of the respective pixels. Further, the row decoder 130 selects a second row, and the column decoder 150 extracts data of respective pixels from the second row, and then amplifies the data of the respective pixels. Through this method, data of all pixels are extracted.

Various types of pixels are used as the pixels for the CMOS image sensor. As representatively commercialized pixel types, there are a 3-Transistor (3-T)-type pixel composed of three basic transistors and one photodiode, and a 4-T-type pixel composed of four basic transistors and one photodiode. FIG. 2 is a circuit diagram showing a typical 3-T-type unit pixel in a CMOS image sensor.

Referring to FIG. 2, the 3-T-type pixel of the CMOS image sensor includes a single photodiode PD for converting photons into electrons, and three NMOS transistors. The three NMOS transistors are a reset transistor Rx for resetting the potential of the photodiode PD, a drive transistor Dx for changing current flowing through a source follower circuit, which is composed of the drive transistor Dx, a selection transistor Sel, and a DC gate, depending on variation in the voltage of a Floating Diffusion (FD) electrode and changing the output voltage of a unit pixel, and the selection transistor Sel for selecting the row address of the pixel array.

In this case, the DC gate denotes a load transistor in which a constant voltage is applied to the gate thereof and which allows constant current to flow through the gate, Vcc denotes a driving voltage, Vss denotes a ground voltage and Output denotes the output voltage of a unit pixel.

That is, the unit pixel of the CMOS image sensor includes a photodiode, a transistor for resetting the photodiode, and three source follower circuits. If the photodiode PD is reset to the voltage Vcc by the reset transistor Rx, and light is radiated to the reset photodiode PD, electrons and holes are formed in the junction area of the photodiode PD. The holes are diffused to a silicon substrate, and the electrons are accumulated in the junction area. If the drive transistor Dx of the source follower circuit is turned on by the accumulated charges and the selection transistor Sel is selected, the output voltage of the unit pixel is generated depending on variation in the voltage of the FD electrode, thus corresponding pixel information is output in the form of analog information.

However, if regular quadrilateral unit pixels are arranged as shown in FIG. 1, there is a problem in that, as the degree of integration increases to improve resolution, the length of the arrangement of the unit pixels increases, so that parasitic resistance and parasitic capacitance increase, and consequently the delay of a control signal increases, thus deteriorating sensitivity.

As a result, a honeycomb-shaped image sensor is used as a scheme for improving resolution while maintaining sensitivity, using the same regular quadrilateral unit pixels.

If the honeycomb-shaped image sensor is used, portions at which image data do not actually exist are formed at locations where horizontal and vertical lines intersect. Data for the locations are interpolated and virtual image data are inserted at the locations, so that resolution can be doubled without increasing the number of lines from which image data are read.

FIG. 3 is a view showing interpolation performed by the conventional honeycomb-shaped image sensor. FIG. 3 shows that regular quadrilateral pixels in even-numbered columns are arranged to be offset ½ pitch from regular quadrilateral pixels in odd-numbered columns so as to implement the honeycomb shape.

However, if regular quadrilateral pixels are arranged to be offset ½ pitch, there may occur a problem in which horizontal and vertical resolutions differ. In detail, horizontal resolution is twice vertical resolution.

DISCLOSURE OF INVENTION

Technical Problem

Accordingly, the present invention has been made keeping in mind the above problems occurring in the prior art, and an object of the present invention is to provide a CMOS image sensor, which can double resolution while maintaining sensitivity.

Technical Solution

In accordance with one aspect of the present invention to accomplish the above object, there is provided a CMOS image sensor, comprising a two-dimensional pixel array including rectangular unit pixels, each having a width to length ratio of 1:2, a row decoder placed on one side of the pixel array to designate a row address, and a column decoder placed on another side of the pixel array to be perpendicular to the row decoder and adapted to extract data of respective pixels from a row selected by the row decoder, amplify the extracted data and generate image data including pixel values.

In accordance with another aspect of the present invention, there is provided a CMOS image sensor, comprising a two-dimensional pixel array including rectangular unit pixels, each having a width to length ratio of 1:2 and each being arranged with an angle of 45 degrees, a row decoder placed on one side of the pixel array to designate a row address, and a column decoder placed along sides of the pixel array rotated at an angle of 45 degrees, the column decoder extracting data of respective pixels from a row selected by the row decoder, amplifying the extracted data and generating image data including pixel values.

In accordance with a further aspect of the present invention, there is provided an image processing apparatus, comprising a CMOS image sensor, including rectangular unit pixels each having a width to length ratio of 1:2, the CMOS image sensor photographing an image and generating image data including pixel values, an image processing unit for receiving the image data from the CMOS image sensor, interpolating pixels, interpolating data for points, at which respective pixels intersect, based on the interpolated pixels, and generating revised image data, a display unit for receiving the revised image data from the image processing unit and displaying the revised image data on a screen, and a control unit for controlling the CMOS image sensor, the image processing unit and the display unit.

In accordance with yet another aspect of the present invention, there is provided a CMOS image sensor, comprising a two-dimensional pixel array including unit pixels each having a polygon shape, a row decoder placed on one side of the pixel array to designate a row address, and a column decoder placed on another side of the pixel array to be perpendicular to the row decoder and adapted to extract data of respective pixels from a row selected by the row decoder, amplify the extracted data and generate image data including pixel values. Preferably, the polygon may have a diamond shape.

In accordance with still another aspect of the present invention, there is provided an image processing apparatus, comprising a CMOS image sensor including diamond-shaped unit pixels, the CMOS image sensor photographing an image and generating image data including pixel values, an image processing unit for receiving the image data from the CMOS image sensor, interpolating pixels, interpolating data for points, at which respective pixels intersect, based on the interpolated pixels, and generating revised image data, a display unit for receiving the revised image data from the image processing unit and displaying the revised image data on a screen, and a control unit for controlling the CMOS image sensor, the image processing unit and the display unit.

Advantageous Effects

The CMOS image sensor according to the present invention is advantageous in that it can easily perform interpolation compared to an image sensor having regular quadrilateral unit pixels, so that the CMOS image sensor has a number of effective pixels that is twice that of actual pixels, thus doubling resolution while maintaining sensitivity.

BRIEF DESCRIPTION OF THE DRAWINGS

FIG. 1 is a view showing a CMOS image sensor having regular quadrilateral unit pixels;

FIG. 2 is a circuit diagram showing a typical 3-T-type unit pixel in a CMOS image sensor;

FIG. 3 is a view showing interpolation performed by a conventional honeycomb-shaped image sensor;

FIG. 4 is a view showing an image sensor having rectangular unit pixels according to an embodiment of the present invention;

FIG. 5 is a block diagram showing an image processing apparatus including an image sensor having rectangular unit pixels according to the present invention;

FIG. 6 is a view showing an example of the interpolation of image data performed by the image processing apparatus including a CMOS image sensor that has rectangular unit pixels each having a width to length ratio of 1:2;

FIG. 7 is a view showing a CMOS image sensor in which rectangular unit pixels each having a width to length ratio of 1:2 are rotated at an angle of 45 degrees;

FIG. 8 is a view showing diamond-shaped unit pixels according to an embodiment of the present invention;

FIG. 9 is a view showing a method of interpolating image data by an image processing apparatus that includes a CMOS image sensor having regular quadrilateral unit pixels;

FIG. 10 is a view showing a method of interpolating image data by an image processing apparatus that includes a CMOS image sensor having diamond-shaped unit pixels; and FIG. 11 is a view showing a CMOS image sensor having diamond-shaped unit pixels, which are arranged in the form of an R, G and B Bayer pattern.

BEST MODE FOR CARRYING OUT THE INVENTION

Hereinafter, embodiments of the present invention will be described in detail with reference to the attached drawings.

FIG. 4 is a view showing an image sensor having rectangular unit pixels according to an embodiment of the present invention.

As shown in FIG. 4, the image sensor of the present invention has rectangular unit pixels each having a width to length ratio of 1:2. As a result, the image sensor of the present invention can maintain the same resolution in horizontal and vertical directions.

FIG. 5 is a block diagram showing an image processing apparatus including an image sensor having rectangular unit pixels according to the present invention. Referring to FIG. 5, the image processing apparatus includes a CMOS image sensor 510, an image processing unit 520, a display unit 530 and a control unit 540. In detail, the CMOS image sensor 510 is constructed so that a plurality of pixels each having a width to length ratio of 1:2 is arranged in a two-dimensional structure, and each pixel converts light into an electrical signal depending on the brightness of light. If the electrical signal is measured, the amount of light input to each pixel can be detected. The amount of light is converted into the electrical signal, so that a pixel-based image can be configured using the electrical signal. A value, obtained by numerically expressing an electrical signal corresponding to the amount of light in this way, is called a pixel value. Such a pixel value can be expressed as a value ranging from 0 to 255.

The image processing unit 520 adjusts image data including pixel values, generated by the image sensor 510, so as to be appropriate to the size of the display unit 530, and executes processing, such as the elimination of noise from an image, or the interpolation of the image. The image processing unit 520 may include four line memory devices to interpolate pixels using a 5×5 mask.

The display unit 530 displays the image data output from the image processing unit 520 on a screen. The display unit 530 may be implemented using a Liquid Crystal Display (LCD). In this case, the display unit 530 may include an LCD controller, memory for storing image data, and an LCD display device.

The control unit 540 functions to control the entire operation of the image processing apparatus.

A process of interpolating an image using the image processing unit 520 is described in detail. In order for the display unit 530 to obtain a full color image, much information about each pixel is required. However, since a pixel value for a single color, among a plurality of colors included in an image, is extracted from each pixel of the image sensor 510, the image processing unit 520 must estimate missing pixel information from neighboring pixel information, using a Color Filter Array (CFA) such as an RGB Bayer pattern. A method of restoring the color of an image using such a color filter array is called color interpolation.

FIG. 6 is a view showing an example of the interpolation of image data performed by the image processing apparatus including a CMOS image sensor that has rectangular unit pixels each having a width to length ratio of 1:2.

Referring to FIG. 6, rectangular unit pixels are arranged to be offset ½ pitch, so that portions 600, at which image data do not actually exist, are formed at locations where horizontal lines and vertical lines intersect. The image processing unit 520 interpolates data for the portions and inserts virtual image data at the portions, thus doubling resolution without increasing the number of lines from which image data are read.

However, when a pixel array is configured using unit pixels each having a width to length ratio of 1:1, as shown in FIG. 3, there is a problem in that the horizontal and vertical resolutions of the pixel array are not the same. That is, if the number of pixels that are not interpolated and the number of interpolated pixels are added and the sum is taken as the total number of pixels, the numbers of pixels in rows and columns constituting the pixel array are not equal to each other. This means that the horizontal and vertical resolutions of the pixel array differ.

However, the present invention uses unit pixels each having a width to length ratio of 1:2 as unit pixels constituting the pixel array, thus solving the problem in which a difference exists between the horizontal and vertical resolutions of the pixel array. In more detail, as shown in FIG. 6, the pixel array of the present invention has the same number of pieces of pixel data, composed of data of pixels that are not interpolated and data of pixels that are interpolated, for rows and columns. That is, for both rows and columns of the pixel array, data of pixels that are not interpolated and data of pixels that are interpolated are alternately output from the pixel array, so that a screen shape having the same horizontal and vertical resolutions can be obtained, unlike a pixel array having regular quadrilateral unit pixels.

FIG. 7 is a view showing a CMOS image sensor in which rectangular unit pixels each having a width to length ratio of 1:2 are rotated at an angle of 45 degrees.

Referring to FIG. 7, a row decoder 730 designating a row address is arranged on one side of a pixel array 700 around the pixel array 700, and at least two column decoders 710 and 720, which are connected to the data output of pixels and serve to designate the column address of the pixels, are arranged along the sides of the pixel array 700.

As described above, if the entire pixel array 700 is rotated at an angle of 45 degrees, data output of the pixels are divided and provided to the two column decoders 710 and 720, so the design of the column decoder becomes simpler.

The unit pixels, constituting the CMOS image sensor, are formed in the shape of rectangles, and the advantages obtained by the rectangular unit pixels are as described above with reference to FIG. 6.

If the image sensor, in which the rectangular unit pixels are caused to be offset ½ pitch and are rotated at an angle of 45 degrees, is implemented according to the spirit of the present invention, there is an advantage in that, since the column decoders can be located on two sides of the pixel array, not one side, the layout of a column Corrected Double Sampling (CDS) circuit, etc. becomes simpler. That is, at least two column decoders are included in one pixel array 700, thereby resulting in an advantage in that a spatial margin, in which a plurality of devices connected to the column decoders is arranged, is increased two times or more.

Meanwhile, the unit pixels of the CMOS image sensor can be implemented using polygon shapes. According to an embodiment of the present invention, the unit pixels can have a diamond shape as one type of polygon as shown in FIG. 8. The image processing apparatus having diamond-shaped unit pixels can be constructed as shown in FIG. 5, so a repeated description thereof is omitted.

FIG. 9 is a view showing a method of interpolating image data by an image processing apparatus that includes a CMOS image sensor having regular quadrilateral unit pixels, and FIG. 10 is a view showing a method of interpolating image data by an image processing apparatus that includes a CMOS image sensor having diamond-shaped unit pixels. If FIGS. 9 and 10 are compared to each other, unit pixels are alternately arranged when the unit pixels are diamond-shaped, so that portions (dots indicated by grey color), in which image data do not actually exist, are formed at locations where horizontal lines and vertical lines intersect. The image processing unit 520 interpolates data for the portions and inserts virtual image data at the portions, thus doubling resolution without increasing the number of lines from which image data are read.

Meanwhile, methods of interpolating pixels are classified into nonadaptive algorithms and adaptive algorithms. Nonadaptive algorithms are implemented to perform interpolation on all pixels using a fixed pattern, and are advantageous in that it is easy to execute the algorithms and the number of calculations is small.

Adaptive algorithms are implemented to estimate a missing pixel value using the characteristics of neighboring pixels that are most effective for finding the missing pixel value, and involve a lot of calculations, but they can obtain better images than can the nonadaptive algorithms. Nonadaptive algorithms are classified into Nearest Neighbor Replication, Bilinear Interpolation, Median Interpolation, Gradual Color Variation Interpolation, etc., and nonadaptive algorithms are classified into a Pattern Matching based Interpolation Algorithm, Interpolation using a threshold-based variable number of gradients, Edge Sensing Interpolation, etc.

Bilinear interpolation, which is the most representative of the interpolation algorithms, is described. Bilinear interpolation is a method of allocating a value, obtained by multiplying weights by four nearest pixel values, to a center pixel value. The respective weights are linearly determined, and are in direct proportion to the distances between the center pixel and corresponding pixels existing at respective locations.

With reference to FIG. 11, a method of interpolating image data using bilinear interpolation by the image processing unit according to a preferred embodiment of the present invention is described. FIG. 11 is a view showing a CMOS image sensor having diamond-shaped unit pixels, which are arranged in an R, G and B Bayer pattern. The image processing unit interpolates R, G and B components of each pixel, and then interpolates data for locations, at which horizontal lines and vertical lines intersect, based on the R, G and B components of each pixel. In detail, R, G and B components are determined at a pixel G42 by bilinear interpolation as shown in the following Equation 1.

$$R42=(R32+R53)/2$$

$$G42=G42$$

$$B42=(B33+B52)/2 \quad <\text{Equation 1}>$$

Further, R, G and B components are determined at a pixel G43 by bilinear interpolation as shown in the following Equation 2.

$$R43=(R34+R53)/2$$

$$G43=G43$$

$$B43=(B33+B54)/2 \quad <\text{Equation 2}>$$

Further, R, G and B components are determined at a pixel B33 by bilinear interpolation as shown in the following Equation 3.

$$R33=(R13+R34+R53+R32)/4$$

$$G33=(G22+G23+G43+G42)/4$$

$$B33=B33 \quad <\text{Equation 3}>$$

Further, R, G and B components are determined at a pixel R53 by bilinear interpolation as in the following Equation 4.

$$R53=R53$$

$$G53=(G42+G43+G63+G62)/4$$

$$B53=(B33+B54+B73+B52)/4 \quad <\text{Equation 4}>$$

Thereafter, the image processing unit inserts and interpolates virtual image data at the location indicated by reference numeral 800, as shown in Equation 5.

$$R=(R33+R43+R53+R42)/4$$

$$G=(G33+G43+G53+G42)/4$$

$$B=(B33+B43+B53+B42)/4 \quad <\text{Equation 5}>$$

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is

1. A CMOS image sensor, comprising:
a plurality of pixel sensors arranged in a form of a two-dimensional array, each pixel sensor having a width-to-length ratio of about 1:2, whereby the each pixel sensor is rectangular, and vertical and horizontal resolutions of the two-dimensional array of the plurality of pixel sensors are the same,
wherein rows and columns of the two-dimensional array of the plurality of pixel sensors have the same number of pixel data, composed of data of pixels that are not interpolated and data of pixels that are interpolated,
the data of pixels that are interpolated are inserted at points where a vertical and a horizontal lines intersect,
for both the rows and columns of the two-dimensional array of the plurality of pixel sensors, the data of pixels that are not interpolated and the data of pixels that are interpolated are alternately output from the two-dimensional array of the plurality of pixel sensors, and
pixel values of color of the data of pixels that are interpolated are estimated from neighboring data of pixels.

2. The CMOS image sensor of claim 1, comprising:
a row decoder connected to each of the plurality of pixel sensors, the row decoder configured to designate a row address; and
a column decoder connected to the each of the plurality of pixel sensors, the column decoder being arranged to extract data of respective pixel sensors from a row selected by the row decoder.

3. The CMOS image sensor of claim 1, wherein the each of the plurality of pixel sensors is tilted by angle of about 45 degrees.

4. An image processing device, comprising:
a CMOS image sensor, the CMOS image sensor including a plurality of pixel sensors arranged in a form of a two-dimensional array, each pixel sensor having a width-to-length ratio of about 1:2, whereby the each pixel sensor is rectangular, and vertical and horizontal resolutions of the two-dimensional array of the plurality of pixel sensors are the same;
an image processing unit, the image processing unit configured to receive an image from the CMOS image sensor, interpolate data for points at which pixels intersect, based on pixel data of adjacent pixels, and generate revised image data therefrom; and
a display unit, the display unit configured to receive the revised image data from the image processing unit and display the revised image data on a screen,
wherein rows and columns of the two-dimensional array of the plurality of pixel sensors have the same number of pixel data, composed of data of pixels that are not interpolated and data of pixels that are interpolated,
the data of pixels that are interpolated are inserted at points where a vertical and a horizontal lines intersect,
for both the rows and columns of the two-dimensional array of the plurality of pixel sensors, the data of pixels that are not interpolated and the data of pixels that are interpolated are alternately output from the two-dimensional array of the plurality of pixel sensors, and
pixel values of color of the data of pixels that are interpolated are estimated from neighboring data of pixels.

5. A CMOS image sensor, comprising:
a plurality of pixel sensors arranged in a form of a two-dimensional array, each pixel sensor being a substantially diamond-shaped polygon, and vertical and horizontal resolutions of the two-dimensional array of the plurality of pixel sensors being the same,
wherein rows and columns of the two-dimensional array of the plurality of pixel sensors have the same number of pixel data, composed of data of pixels that are not interpolated and data of pixels that are interpolated,
the data of pixels that are interpolated are inserted at points where a vertical and a horizontal lines intersect,
for both the rows and columns of the two-dimensional array of the plurality of pixel sensors, the data of pixels that are not interpolated and the data of pixels that are interpolated are alternately output from the two-dimensional array of the plurality of pixel sensors, and
pixel values of color of the data of pixels that are interpolated are estimated from neighboring data of pixels.

6. The CMOS image sensor of claim 5, comprising:
a row decoder connected to each of the plurality of pixel sensors, the row decoder configured to designate a row address; and
a column decoder connected to the each of the plurality of pixel sensors, the column decoder being arranged to extract data of respective pixel sensors from a row selected by the row decoder.

7. The CMOS image sensor of claim 1, wherein the data of pixels that are interpolated is a virtual image data.

8. The image processing device of claim 4, wherein the data of pixels that are interpolated is a virtual image data.

9. The CMOS image sensor of claim 5, wherein the data of pixels that are interpolated is a virtual image data.

10. The CMOS image sensor of claim 1, wherein pixel values of the color of the interpolated data of pixels are allocated based on weighted data of a plurality of nearest pixels.

11. The image processing device of claim 4, wherein pixel values of the color of the interpolated data of pixels are allocated based on weighted data of a plurality of nearest pixels.

12. The CMOS image sensor of claim 5, wherein pixel values of the color of the interpolated data of pixels are allocated based on weighted data of a plurality of nearest pixels.

* * * * *